United States Patent Office 3,356,501 Patented Dec. 5, 1967

3,356,501
GELATIN PRINTING PLATES WITH THERMOPLASTIC UNDERLAYER

Derek John Tongs, Brighton, Sussex, England, assignor to Koch Processes Limited, London, England, a British company No Drawing. Filed Jan. 4, 1962, Ser. No. 164,410
Claims priority, application Great Britain, Jan. 6, 1961, 696/61
2 Claims. (Cl. 96—36.3)

ABSTRACT OF THE DISCLOSURE

Relief printing is improved by the use of colloid relief printing plates formed of a layer of thermoplastic resin, typically polystyrene, about 0.01 inch in thickness fixed to a base sheet which is, in turn, overlayed with about 0.01 inch of photosensitive colloid, typically, dichromated gelatine, whereupon a printing image formed by a light-hardened relief pattern in the photosensitive colloid is extended into the thermoplastic layer by washing with a solvent for the thermoplastic layer, printing ink then being applied to the printing image portions of the plate formed of hardened colloid overlaying a similarly shaped thermoplastic resin layer providing a relief pattern of depth greater than the thickness of the colloid layer.

*Background of the invention*

In the production of relief printing plates consisting of a sheet of base material carrying a layer of a photosensitive colloid, for example dichromated gelatine, in which the relief has been formed by the exposure to light of selected areas and development by washing out with a suitable solvent, such as water, the disadvantage has been found that the depth of relief is limited by the thickness of the layer of colloid, which is itself limited in practice, inter alia, by the tendency of the colloid material to shrink on drying. The employment of relatively thick layers of gelatine is not practicable for this reason, and it would not be possible to ink shallow relief plates on many printing machines at present in use without applying some ink to the bottom of the depressions in the relief pattern, with consequent smudging of the print.

*Summary of the invention*

The relief printing plate according to the invention comprises a sheet of base material, a layer of thermoplastic or other plastics material adherent thereto, and a superimposed layer of a light-hardened photosensitive colloid adherent to the plastic, at least some of the depressions constituting the relief pattern extending into the plastics layer. The thermoplastic or other plastics material, examples of which include polyvinyl chloride, polystyrene and cellulose acetate may itself be photosensitive or not, as desired.

The present invention also provides a method of producing a relief printing plate which includes the steps of preparing sensitised plate stock comprising a sheet of base material, a layer of thermoplastic or other plastics material adherent thereto and a superimposed layer of a photosensitive colloid adherent to the plastics material, exposing selected areas of the face of the sensitised stock to light to render the colloid in those areas less soluble in a solvent for the colloid, washing the face of the stock with the solvent for the colloid to remove colloid from the unexposed areas, and thereafter washing the face of the stock with a solvent for the plastic which is not a solvent for the colloid to remove plastic from the portions of the plastics layer exposed by the complete removal of the colloid therefrom.

The maximum depth of relief so obtainable is equal to the sum of the thicknesses of the plastic and the colloid layer. The thickness of the plastics layer may exceed, be equal to, or be less than the thickness of the colloid layer. Thus, for example, a layer of plastic of equal thickness to that of the colloid can satisfactorily be used, and a maximum depth of relief double that obtainable with a single layer of colloid is thereby readily achieved.

The colloid and the plastic used therewith should be chosen so that solvents conforming to the requirements given above can be selected. One such suitable combination is gelatine, with water as solvent, and polystyrene, with toluene as solvent. The plastic may adhere to the base, and the colloid to the plastic, or suitable adhesives may be used where necessary. The plastic may be applied to the base as a film, or by casting or coating methods.

It is not always necessary that all depressions in the plate should be of the maximum depth. The depressions between adjacent type characters are not sufficiently wide to permit entry of the inking medium, and for these depressions a depth of as little as half the thickness of the colloid layer alone may suffice. On the other hand, it is desirable that the larger non-printing areas should have the full benefit of additional depth afforded by the present invention.

The action of the solvent for the plastic is confined to those portions of the stock where the plastic is exposed, and the removal of plastic can if desired be confined to the larger non-printing areas by painting over the other, for example type-covered, areas with a material which will resist the action of the solvent under the conditions employed. Under normal conditions, however, the desired restriction of the area of attack of the solvent will be achieved automatically, since there is a slight spread of illumination through the thickness of the colloid layer during exposure to light, and in areas of closely packed relief characters the exposed regions will overlap in the deeper portions of the layer. Thus, when the solvent for the colloid is applied, the colloid will be completely removed only in the larger non-printing areas, while in the areas of closely packed characters a sufficient thickness of colloid will remain to resist the subsequent action of the solvent for the plastic.

It is desirable for reasons of stability that the shoulders of the relief pattern on a relief plate should be sloping, and this conformation is readily achieved in the present case by the action of the solvent on the plastic layer. It is preferable also that the plastic should not swell substantially under the action of the chosen solvent, but be progressively removed from the exposed surface of the plastic layer. The use of polystyrene and toluene complies with this requirement.

The conditions of treatment of the stock with solvent, and especially with the solvent for the plastic, should be so adjusted that undercutting of the upstanding portions of the relief pattern is slow. Even slight undercutting of a small character such as an *i*-dot can result in complete removal of the character.

The invention is suitable for the production of flat-bed or wrap-round printing plates. The base material may for example consist of metal or synthetic resin. In the case of a wrap-round plate a substantially flexible base material must be used.

One embodiment of the application of the invention will be described by way of example.

The base material in this example consists of a polyester resin-impregnated woven glass fibre material, having adequate flexibility for use as a wrap-round plate. To a sheet of the base material is stuck face to face a film of polystyrene of, say, 0.010 inch thickness, using a modified epoxy or other suitable adhesive. To the face of the polystyrene film is applied an 0.010 inch layer of gelatine composition, by means of several successive applications of an aqueous solution of the gelatine composition with intermediate drying, or by the transfer of a dried film of gelatine of the desired thickness. The gelatine layer is dried to obtain the completed plate stock, which is subsequently sensitised by treatment with 1% ammonium dichromate in the conventional manner.

The gelatine layer is then exposed to intense illumination over the areas corresponding to the desired relief pattern, and the exposed plate stock is developed with warm water in the conventional manner. In areas of closely spaced characters the colloid layer is nowhere removed to the extent of the full thickness of the layer, but in the larger non-printing areas, where the spread of illumination within the colloid layer has not led to overlapping of the exposed regions, the entire thickness of the colloid layer is removed.

The exposed and developed stock is then dried and either immersed in toluene and gently brushed to ensure movement of the solvent over the face of the stock or bathed in the solvent and brushed after removal from the bath. When sufficient of the polystyrene layer has been removed, the now completed plate is dried.

In this manner, a depth of depression in the larger non-printing areas of 0.020 inch is easily achieved.

I claim:

1. A method of relief printing which comprises providing a sensitized plate stock formed of a sheet of base material having fixed thereto a layer of water-insoluble synthetic thermoplastic material selected from the group consisting of polyvinyl chloride, polystyrene and cellulose acetate about 0.01 inch in thickness and superimposed thereon an adherent layer of gelatine about 0.01 inch in thickness that is sensitized to become insoluble in water upon exposure to light, exposing selected areas of said gelatine layer to light to render the gelatine in those areas insoluble in water, developing the face of the exposed plate stock with warm water to remove gelatine in the exposed areas, washing the face of the plate stock with an organic solvent capable of dissolving said thermoplastic material without substantial swelling in which gelatine is insoluble to remove the thermoplastic material from portions of the layer thereof exposed by complete removal of the gelatine covering said portions providing a relief printing plate having a relief pattern of depth greater than the thickness of said gelatine layer, drying the completed plate, applying printing ink to the patterned face of the printing plate and printing with the inked printing plate.

2. A method of relief printing which comprises providing a sensitized plate stock formed of a sheet of base material having fixed thereto a layer of polystyrene about 0.01 inch in thickness and superimposed thereon an adherent layer of dichromated gelatine about 0.01 inch in thickness, exposing selected areas of said gelatine layer to light to render the gelatine in those areas insoluble in water, developing the face of the exposed plate stock with warm water to remove gelatine in the unexposed areas, washing the face of the plate stock with toluene to remove polystyrene from portions of the polystyrene layer exposed by complete removal of the gelatine covering said portions providing a relief printing plate having a relief pattern of depth greater than the thickness of said gelatine layer, drying the completed plate, applying printing ink to the patterned face of the printing plate and printing with the inked printing plate.

References Cited

UNITED STATES PATENTS

| | | | |
|---|---|---|---|
| 1,655,127 | 1/1928 | Beebe | 96—35 |
| 2,446,915 | 8/1948 | Filmer | 96—35 |
| 2,494,053 | 1/1950 | Mitson et al. | 96—35 X |
| 2,548,565 | 8/1951 | Staehle | 96—35 |
| 2,544,905 | 3/1951 | Van Deusen | 96—36 |
| 2,964,401 | 12/1960 | Plambeck | 96—35 |
| 2,257,143 | 9/1941 | Wood | 96—36 |
| 3,169,066 | 2/1965 | Hoerner | 96—35 |

OTHER REFERENCES

Simonds et al., Handbook of Plastics, 1949, p. 422.

British Plastics, vol. 31, No. 2, February 1958, pp. 58–62.

Hepher et al., Penrose Annual, vol. 48, 1954, pp. 139–141.

NORMAN G. TORCHIN, *Primary Examiner.*

HAROLD N. BURSTEIN, *Examiner.*

A. D. RICCI, I. RAUBITSCHEK, *Assistant Examiners.*